(12) United States Patent
Tatartchenko et al.

(10) Patent No.: US 8,652,658 B2
(45) Date of Patent: Feb. 18, 2014

(54) C-PLANE SAPPHIRE METHOD AND APPARATUS

(75) Inventors: Vitali Tatartchenko, Puteaux (FR); Christopher D. Jones, Amherst, NH (US); Steven Anthony Zanella, Dublin, NH (US); John W. Locher, Amherst, NH (US); Fery Pranadi, Nashua, NH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 669 days.

(21) Appl. No.: 11/858,949

(22) Filed: Sep. 21, 2007

(65) Prior Publication Data

US 2008/0075941 A1    Mar. 27, 2008

Related U.S. Application Data

(60) Provisional application No. 60/826,723, filed on Sep. 22, 2006.

(51) Int. Cl.

| | |
|---|---|
| *B32B 5/00* | (2006.01) |
| *B32B 7/00* | (2006.01) |
| *B32B 27/32* | (2006.01) |
| *B32B 9/00* | (2006.01) |
| *B32B 19/00* | (2006.01) |
| *C01F 7/02* | (2006.01) |

(52) U.S. Cl.
USPC .............. 428/702; 428/96; 428/220; 423/625

(58) Field of Classification Search
USPC ............................ 423/625; 428/98, 220, 702
See application file for complete search history.

(56) References Cited

U.S. PATENT DOCUMENTS

| | | | |
|---|---|---|---|
| 3,471,266 A | | 10/1969 | LaBelle, Jr. |
| 3,591,348 A | | 7/1971 | La Belle, Jr. |
| 3,608,050 A | | 9/1971 | Carman et al. |
| 3,846,082 A | | 11/1974 | La Belle, Jr. et al. |
| 3,915,662 A | | 10/1975 | La Belle, Jr. et al. |
| 3,953,174 A | | 4/1976 | LaBelle, Jr. |
| 4,126,731 A | | 11/1978 | Nishizawa et al. |
| 4,158,038 A | | 6/1979 | Jewett |
| 4,248,645 A | | 2/1981 | Jewett |
| 4,303,465 A | * | 12/1981 | Bagdasarov et al. ........... 117/82 |
| 4,402,786 A | | 9/1983 | Little et al. |
| 5,398,640 A | | 3/1995 | Locher et al. |

(Continued)

FOREIGN PATENT DOCUMENTS

| | | |
|---|---|---|
| EP | 0493903 | 8/1992 |
| GB | 2044630 | 10/1980 |

(Continued)

OTHER PUBLICATIONS

Machine English Translation of JP 2003-327495 retrieved from the JPO website on Oct. 2, 2010.*

(Continued)

*Primary Examiner* — Jonathan Langman
(74) *Attorney, Agent, or Firm* — Abel Law Group, LLP; Robert N. Young

(57) ABSTRACT

A method and apparatus for the production of C-plane single crystal sapphire is disclosed. The method and apparatus may use edge defined film-fed growth techniques for the production of single crystal material exhibiting low polycrystallinity and/or low dislocation density.

9 Claims, 8 Drawing Sheets

(56) References Cited

U.S. PATENT DOCUMENTS

| | | | |
|---|---|---|---|
| 5,451,553 | A | 9/1995 | Scott et al. |
| 5,558,712 | A | 9/1996 | Kalejs |
| 5,660,627 | A | 8/1997 | Manente et al. |
| 6,177,236 | B1 | 1/2001 | Apte |
| 6,413,311 | B2 | 7/2002 | Melcher et al. |
| 6,642,989 | B2 | 11/2003 | Umehara et al. |
| 7,067,007 | B2 | 6/2006 | Ackermann et al. |
| 7,282,381 | B2 | 10/2007 | Feltin et al. |
| 2004/0099206 | A1 | 5/2004 | Achermann et al. |
| 2005/0193942 | A1 | 9/2005 | Gorgoni et al. |
| 2005/0227117 | A1 | 10/2005 | Locher et al. |
| 2005/0247260 | A1 | 11/2005 | Shin et al. |
| 2008/0282968 | A1 | 11/2008 | Amosov |

FOREIGN PATENT DOCUMENTS

| | | |
|---|---|---|
| JP | 57095899 | 6/1982 |
| JP | 2003112998 | 4/2003 |
| JP | 2003327495 | 11/2003 |
| JP | 2004083407 A | 3/2004 |
| JP | 2005314216 A | 11/2005 |
| JP | 2006176359 A | 7/2006 |
| WO | 2005100646 | 10/2005 |
| WO | 2006012924 A1 | 2/2006 |

OTHER PUBLICATIONS

Flerov et al., "The way to producing of the perfect sapphire crystals", Mat. Res. Soc. Symp., vol. 329, 1994, pp. 51-56.*

Miyazawa, "Optical Crystals survived in Information Technology Systems", Opto-Electronics Review, vol. 11, 2003, pp. 77-84.*

Wang et al., "Dislocation Analysis for Large-Sized Sapphire Single Crystal Grown by SAPMAC method", Chinese Journal of Structural Chemistry, vol. 26, No. 11, 2007, pp. 1332-1336.*

Certified English Translation of JP 2003-327495 to Yoichi et al., published Nov. 19, 2003.*

Wada et al., Growth and Characterization of Sapphire Ribbon Crystals, Journal of Crystal Growth, vol. 50, 1980, pp. 151-159.*

International Search Report and Written Opinion dated Jul. 28, 2005 issued in PCT patent application No. PCT/US05/011404.

International Search Report and Written Opinion dated Jan. 4, 2008 issued in corresponding PCT patent application No. PCT/US07/079149.

U.S. Appl. No. 60/981,983, filed Oct. 23, 2007.

U.S. Appl. No. 60/989,756, filed Nov. 21, 2007.

Locher, J. W., et al., "The Production of 225*325 mm Sapphire Windows for IR (1 to 5 mu xm) Applications", Database Inspection Online, vol. 5078, No. 1, 2003, pp. 40-46. Abstract Only.

Novak, R. E., et al., "The Production of EFG Sapphire Ribbon for Heteroepitaxial Silicon Substrates," Journal of Crystal Growth, vol. 50, 1980, pp. 143-150.

Antonov, P. I., et al., "A Review of Developments in Shaped Crystal Growth of Sapphire by the Stepanov and Related Techniques", Progress of Crystal Growth and Characterization of Materials, pp. 63-122, 2002.

Locher, et al., "Large Diameter Sapphire Window from Single Crystal Sheets", Proceedings of the 5TH DOD Electromagnetic Window Symposium, Oct. 1993.

Denisov et al, 'Optical Anomalies and Residual Stresses in Basal-Plane-Faceted Ribbons of Stepanov-Grown Sapphire Crystals', Defects and Impurity Centers, Dislocations, and Physics of Strength, ISSN1063-7834, Physics of the Solid State, 2007, vol. 49, No. 3, pp. 472-477. Pleiades Publishing, Ltd., 2007.

Australian Examination Reported dated Apr. 1, 2010 issued in Australian Patent Application No. 2007299677, 3 pages.

International Search Report and Written Opinion dated May 26, 2009 issued in PCT International Application No. PCT/US08/84277, 12 pages.

International Preliminary Report on Patentability issued Apr. 2, 2009 in corresponding PCT Application No. PCT/US2007/079149, 10 pages.

Translation of Title and Abstract of DD 202 901 A1 by Thomas P. Weber, "Instructions for the crystallization of oxidic single crystals according to the Czochralski-Process", Peter Reiche et al., Berlin, Jun. 17, 1981.

Quotation of Sapphire Plate, Saint-Gobain Crystals & Detectors, www.saphikon.com, dated Apr. 7, 2003.

Declaration of John W. Locher: "Single Crystals and Methods for Fabricating Same", U.S. Appl. No. 10/476,364, executed on Oct. 14, 2009.

Non-Final Office Action concerning U.S. Appl. No. 12/021,758, mailed May 3, 2011.

David R. Black et al., "X-Ray Topography,"Materials Science and Engineering Laboratory, Special Publication 960-10, NIST Recommended Practice Guide (National Institute of Standards and Technology), U.S. Government Printing Office, dated Apr. 2004, 6 pages.

Declaration Under 37 C.F.R. §1.132 (Flerov and Wang) signed by Christopher D. Jones for U.S. Appl. No. 11/858,949, signature dated Mar. 2, 2012, 6 pages.

Declaration Under 37 C.F.R. §1.132 (Yoichi) signed by Christopher D. Jones for U.S. Appl. No. 11/858,949, signature dated Mar. 7, 2012, 7 pages.

Harris, Daniel C., "A Century of Sapphire Crystal Growth," Proc. of the 10th DoD Electromagnetics Windows Symp., pp. 7 to 10 (2004).

Liu et al., "The Morphology of Etch Pints on a Sapphire Surface," Journal of Phys. and Chem. of Solids, vol. 69, Issue 2-3, pp. 572-75 (2008).

* cited by examiner

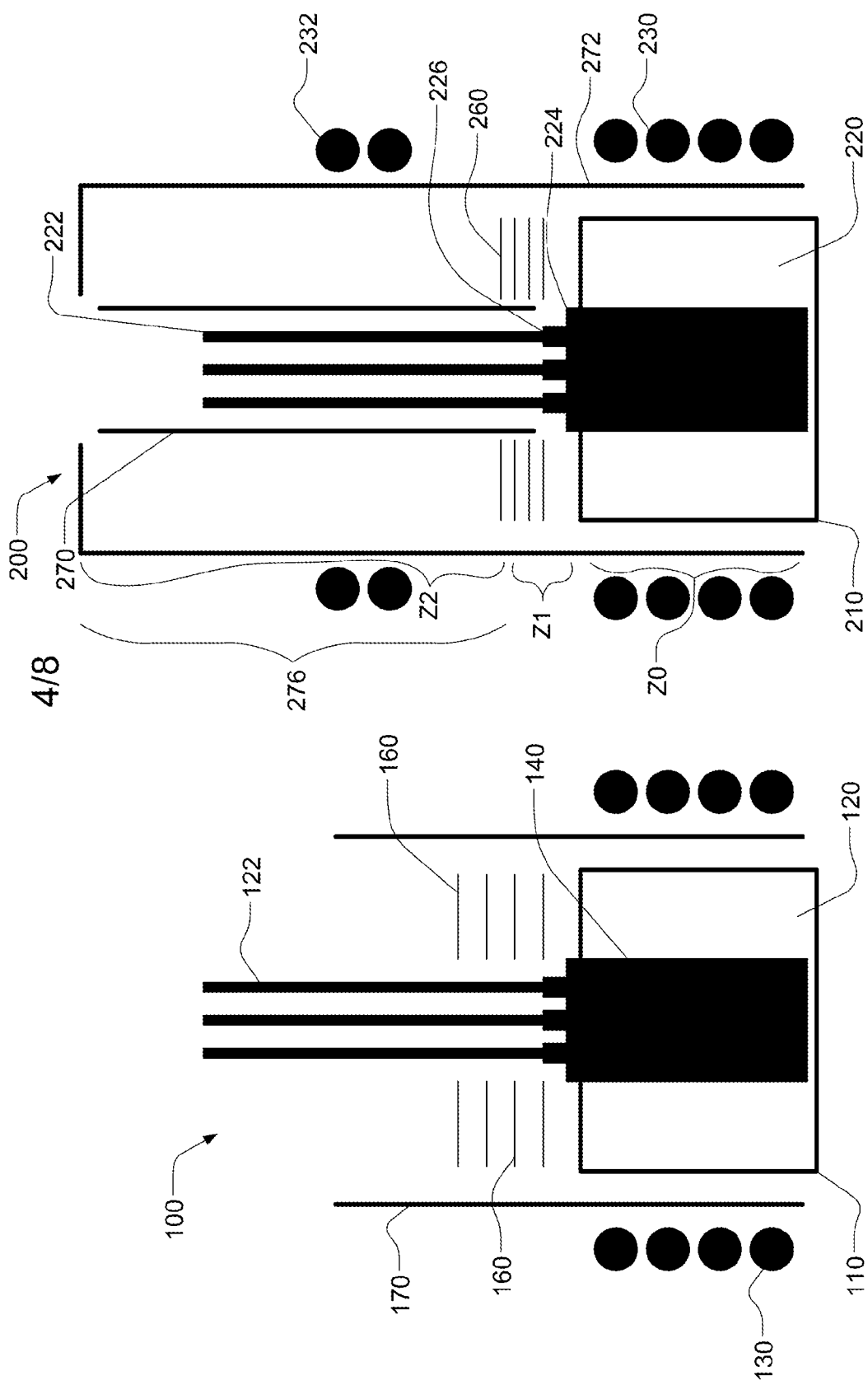

C-PLANE SAPPHIRE METHOD AND APPARATUS

RELATED APPLICATION

This application claims benefit of U.S. Provisional Patent Application Ser. No. 60/826,723 titled "C-PLANE SAPPHIRE METHOD AND APPARATUS," filed Sep. 22, 2006 and which is hereby incorporated by reference herein.

BACKGROUND

1. Field of Invention

The invention relates to ceramics and methods of production and, in particular, to C-plane single crystal sapphire and methods of making C-plane single crystal sapphire.

2. Discussion of Related Art

Single crystal sapphire, or α-alumina, is a ceramic material having properties that make it attractive for use in a number of fields. For example, single crystal sapphire is hard, transparent and heat resistant, making it useful in, for example, optical, electronic, armor and crystal growth applications. Due to the crystalline structure of single crystal sapphire, sapphire sheets may be formed in various planar orientations including C-plane, m-plane, r-plane and a-plane. C-plane single crystal sapphire has homogeneous properties that may provide advantages over other orientations. One application where C-plane sapphire may be preferred is in the field of optics where, for instance, the absence of natural crystallographic birefringence may be advantageous. Other applications include those where faster material removal from the sapphire surface is desired. C-plane sapphire may also be useful in the growth of LEDs, such as, for example, gallium nitride LEDs.

Several techniques for the production of single crystal sapphire are known including the Kyropolos, Czochralski, Horizontal Bridgman, Verneuile technique, heat exchange, and shaped crystal growth techniques such as edge defined film-fed growth methods.

SUMMARY OF INVENTION

The subject matter of this application may involve, in some cases, interrelated products, alternative solutions to a particular problem, and/or a plurality of different uses of a single system or article.

In one aspect a single crystal growth apparatus is provided, the apparatus comprising a melt source, a die adjacent the melt source, a first region exhibiting a first thermal gradient, the first region positioned adjacent the die opening, and a second region exhibiting a second thermal gradient, the second region positioned adjacent the first region and distal to the die wherein the second thermal gradient that is less than the first thermal gradient.

In another aspect, a method of forming single crystal C-plane sapphire material is provided, the method comprising seeding a melt fixture with a seed having a C-axis orientation substantially perpendicular to a longitudinal axis of a die opening, crystallizing single crystal sapphire above the die, the single crystal sapphire exhibiting a C-axis orientation substantially perpendicular to the sapphire's major surface, and cooling the C-plane sapphire to produce a material exhibiting fewer than 10,000 dislocations/cm$^2$.

In another aspect, a method of forming C-plane single crystal sapphire is provided, the method comprising passing sapphire through a first region exhibiting a first thermal gradient, the sapphire being at greater than 1850° C., and subsequently passing the sapphire through a second region exhibiting a second thermal gradient that is less than the first thermal gradient, the sapphire being at greater than 1850° C.

In another aspect, a C-plane single crystal sapphire plate is provided, the plate having a width of greater than or equal to 5 cm and fewer than 1000 dislocations per cm$^2$.

In another aspect, a sapphire wafer is provided, the wafer having fewer than 100 dislocations per cm$^2$.

In another aspect, single crystal sapphire is provided, the single crystal sapphire having a dimension greater than 1 cm and exhibiting fewer than 100 dislocations per cm$^2$.

In another aspect, an apparatus for producing single crystal sapphire is provided, the apparatus comprising a die, a melt source constructed and arranged to be in fluid communication with the at least one cavity, a first heater constructed and arranged to heat the melt source, and a second heater constructed and arranged to heat a region of the apparatus downstream of the die.

In another aspect, an apparatus for producing single crystal sapphire is provided, the apparatus comprising a melt source, a die in fluid communication with the melt source, and a heater constructed and arranged to actively heat both the melt source and a region of the apparatus downstream of the die.

BRIEF DESCRIPTION OF DRAWINGS

In the drawings.

FIG. 4 is another cross-sectional diagram of an embodiment of a single crystal growth apparatus;

FIG. 5 is a cross-sectional diagram of an embodiment of a growth apparatus for the production of C-plane single crystal sapphire;

DETAILED DESCRIPTION

Figure 2:
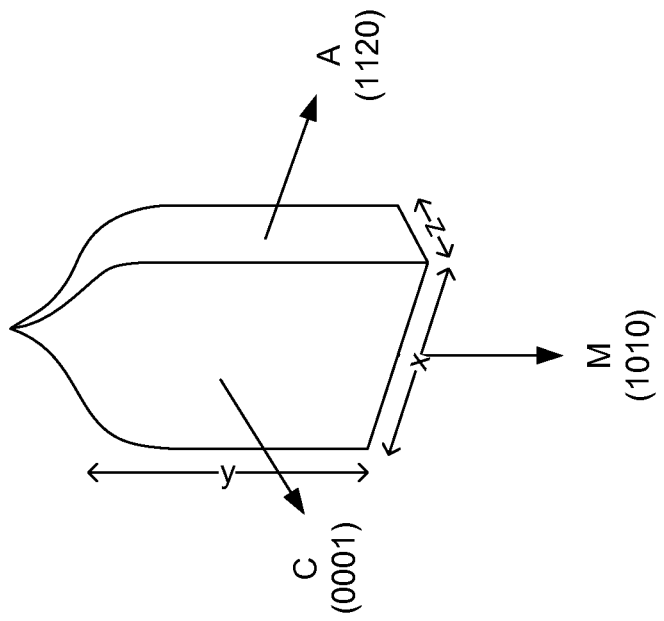
FIG. 2 is a diagram illustrating the crystal orientation of a C-plane single crystalline material.

The materials and methods described in this disclosure include C-plane single crystal sapphire and methods and apparatuses for producing C-plane sapphire. C-plane sapphire may be preferred to other crystal orientations due to its physical, chemical, mechanical and optical properties. For instance, C-plane sapphire wafers may be preferred in optical applications due to the absence of natural crystallographic birefringence. C-plane sapphire ribbons, or sheets, can be grown using, for example, shaped crystal growth techniques such as edge defined film-fed growth methods. The growth apparatus may include regions exhibiting different thermal gradients. These regions may provide different ribbon cooling rates at different times or locations in the production process or apparatus.

"Single Crystal Sapphire" means $\alpha\text{-}Al_2O_3$, also known as corundum, that is primarily single crystal.

"C-plane single crystal sapphire" refers to substantially planar single crystal sapphire, the c-axis of which is substantially normal (+/−10 degrees) to the major planar surface of the material. Typically, the C-axis is less than about 1 degree from the major planar surface. See FIG. 2. The "sapphire C-plane" is as is known in the art and is typically the sapphire plane having a Miller index of 0001 and d spacing of 2.165 Angstroms.

"Dislocation" is used herein as it is used by those skilled in the art and describes a crystal defect that can be detected using X-ray diffraction topography based on Bragg diffraction.

"Thermal gradient" refers to the average change in temperature over distance between two locations in a single crystal sapphire production apparatus. The distance between the two locations is measured on a line along which the single crystal sapphire advances during the production process. For example, in an edge defined film-fed growth technique, the temperature difference may be 50 degrees Celsius between a first position in the furnace and a second position in the furnace. Thermal gradient units may be, for example, "degrees per cm" or "degrees per inch." If not specified, the temperature change is from a higher temperature to a lower temperature as the sapphire crystal passes from the first location to the second through the gradient.

"Ribbon" refers to a plate formed using a shaped crystal growth technique.

It has been shown that uniform a-plane sheets of single crystal sapphire can be produced efficiently using edge defined film-fed growth techniques (see U.S. Patent Application Publication 2005/0227117). However, C-plane sheets are typically sliced from a boule that is grown along different growth orientation using, for example, the Czochralski method. Boules can have various shapes and can be oriented so that there are different orientations of C-axis in different boules. For making wafers, cylinders of the desired diameters can be cored from boules and the desired wafers may be cut from the cylinders, for instance by using a wire saw slicing through the diameter of the cylinder. After cutting, the slice is typically ground and polished to produce a C-plane wafer. Wafer thicknesses may be chosen by first cutting the slice to a pre-chosen width and then lapping to the desired dimensions. Using this method of production to form a plate or wafer from a boule, each sheet or wafer must be cut along its major planar surface at least once. The extreme hardness of single crystal sapphire means that the cutting step may be expensive and time consuming. Additional preparation steps may also be required. Furthermore, the production of larger size wafers, e.g., greater than or equal to 5 or 10 cm in diameter, may take weeks due to, in part, the secondary and tertiary operations. Adding an inch to the diameter of a wafer can double the required production time.

C-plane single crystal sapphire formed in sheets or ribbons could reduce or shorten many of these preparation steps. For this reason and others, C-plane sheets exhibiting good optical characteristics and formed in sheets of appropriate thickness could provide a preferred source for C-plane single crystal sapphire.

Dislocations are typically undesirable in crystals and crystals with fewer dislocations may be preferred. When a crystal wafer, such as a sapphire crystal wafer, is used as a substrate to grow other crystals such as GaN, a lower density of dislocations in the wafer may lead to a decreased number of dislocations in the GaN crystal. It is also believed that a large number of dislocations may lead to a break into polycrystallinity. Thus, a lower number of dislocations typically means a crystal of higher quality.

Dislocation density may be determined by counting the number of individual hairline dislocations apparent in an X-ray topograph of a specific crystal and dividing the total number of dislocations by the surface area of the crystal. For example, the 10 cm diameter circular wafer shown in FIG. 10 reveals approximately 80,000 dislocations meaning a dislocation density of about 1000 dislocations per $cm^2$.

Shaped crystal growth techniques such as edge defined film-fed growth methods can be used to grow large sheets of single crystal sapphire. For instance, see commonly owned United States Patent Application Publication Number 2005/0227117 which is incorporated by reference herein in its entirety. A cross-sectional view of an edge defined film-fed growth apparatus is provided in FIG. 3A. Crystal growth apparatus 100 includes crucible 110 that may contain melt 120. The temperature of the crucible may be raised and maintained above the melting temperature of the melt by induction heating coil 130. Melt can be drawn through capillary feed die 140 in an upward direction to form a crystal at melt interface 150, at the top of the die. As the ribbon is pulled upwards, growth proceeds vertically until the ribbon is of a desired length. Although ribbon growth is discussed herein, the methods and apparatus may be equally applicable to tubes and/or other shapes.

Figure 1:
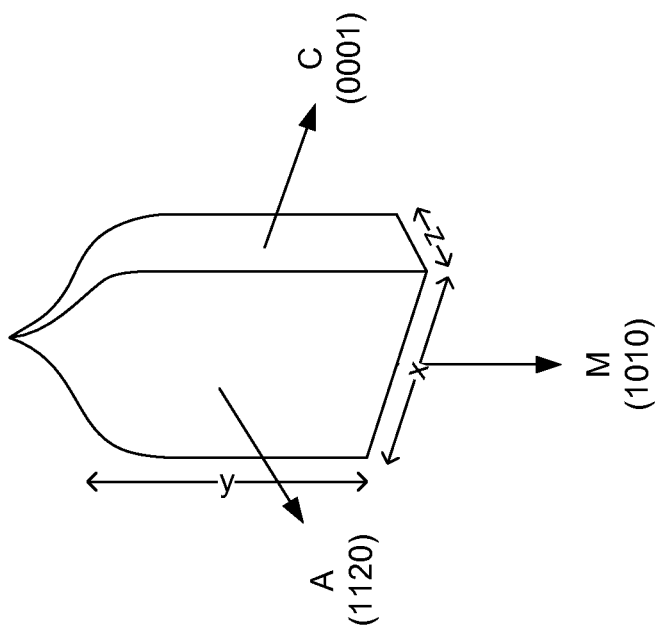
FIG. 1 is a diagram illustrating the crystal orientation of an a-plane single crystalline material.

Using edge defined film-fed growth techniques large sheets may be grown with the thickness of the sheet being determined by, in part, the geometry of the die that is used. These sheets are typically "a-plane" sheets, i.e., the a axis is normal to the major planar surface. For example, see FIG. 1. In contrast, many of the methods described herein are directed to the formation of "C-plane" sheets, tubes or ribbons, as illustrated in FIG. 2. A visual comparison of the figures shows that the difference between the plates of FIG. 1 and FIG. 2 is that the crystal orientation has been rotated approximately 90 degrees to render the C axis normal to the major plane (surface of greatest area) of the sheet. The width of the sheet is indicated by "x," the length by "y," and the thickness by "z." In both FIGS. 1 and 2, the m axis of the crystal is in substantially the same direction as is the central vertical y axis of the sheet, although it could be rotated. For instance, the crystal could be rotated around the C-axis so that the a and m axes change positions. Intermediate orientations known to those of skill in the art may also occur.

The crystal orientation of a single crystal material can often be fixed by the placement of a seed crystal at the melt interface, for example, at the upper surface of a capillary feed die. The seed may be of sapphire or other material. The single crystal material formed from the melt typically crystallizes in an orientation that is in alignment with that of the seed. Thus, to form C-plane sheets instead of a-plane sheets, the seed may be rotated 90 degrees about its vertical axis from the a-plane position. As the single crystal material is formed, its crystal orientation may align with that of the seed to produce a single crystal sheet having a C-plane orientation.

Attempts at producing C-plane single crystal sapphire by edge defined film-fed growth techniques were made by rotating the seed 90 degrees from the a-plane position and drawing the melt under conditions that have been successful in producing a-plane material. Results using these known techniques were unsatisfactory with significant polycrystallization resulting in a product that may not be useable in many applications. C-plane material has unique properties, one or more of which may explain why it cannot be produced using these methods. For example, compared to other orientations, C-plane material may have a unique singular crystallographic face. Compared to other single crystal sapphire orientations, C-plane material may have maximal surface density, high free surface energy, different thermal conductivity and a different growth speed. One or more of these properties may result in crystal growth behavior that is different from that of a-plane and/or other crystal orientations.

It has been found that high quality C-plane single crystal sapphire ribbons can be successfully made using an edge defined film-fed growth technique. Successful techniques may include, for example, using different thermal gradients at different points in the edge defined film fed growth apparatus. For example, the crystal growth apparatus may include a first region having a first thermal gradient and a second region having a second thermal gradient. In some embodiments the second thermal gradient may be positioned later in the production process and may be of a lower value than the first thermal gradient. An apparatus may include one, two, three or more distinct thermal gradient regions.

In some embodiments, single crystal sapphire exhibiting little or no polycrystallinity can be produced by subjecting the crystal to a higher rate of cooling immediately after formation from a melt and subsequently reducing the rate of cooling as the crystal advances through the production process. The rate of cooling may be controlled, at least partially, by the thermal gradient in the apparatus and/or by the rate of growth of the crystal. Once the material has cooled to below the brittle-ductile transition point it may be subjected to an uncontrolled rate of cooling although some control may still be desirable.

Figure 3A:
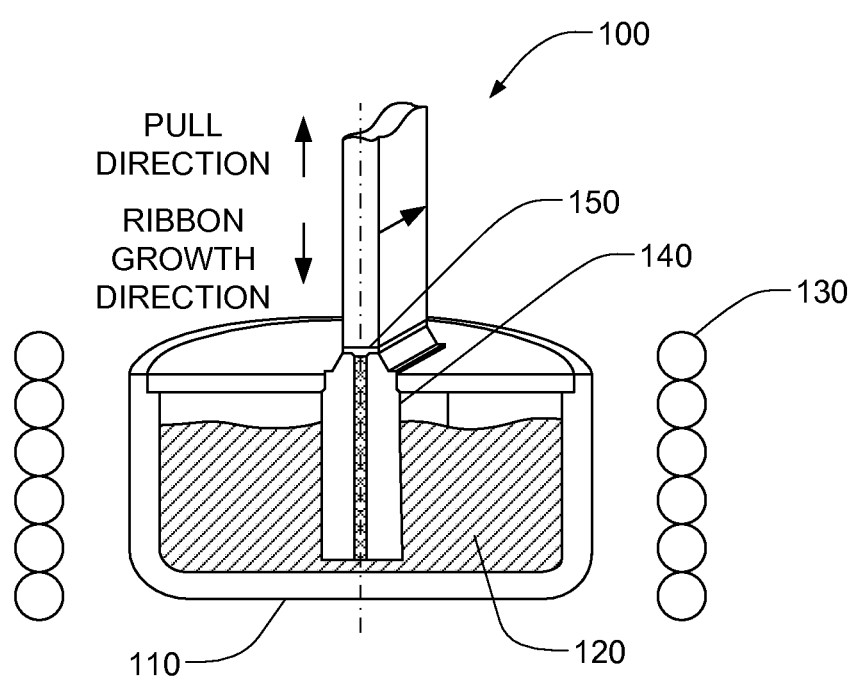
FIG. 3A is a cross-sectional diagram of an embodiment of a single crystal growth apparatus.
Figure 3B:
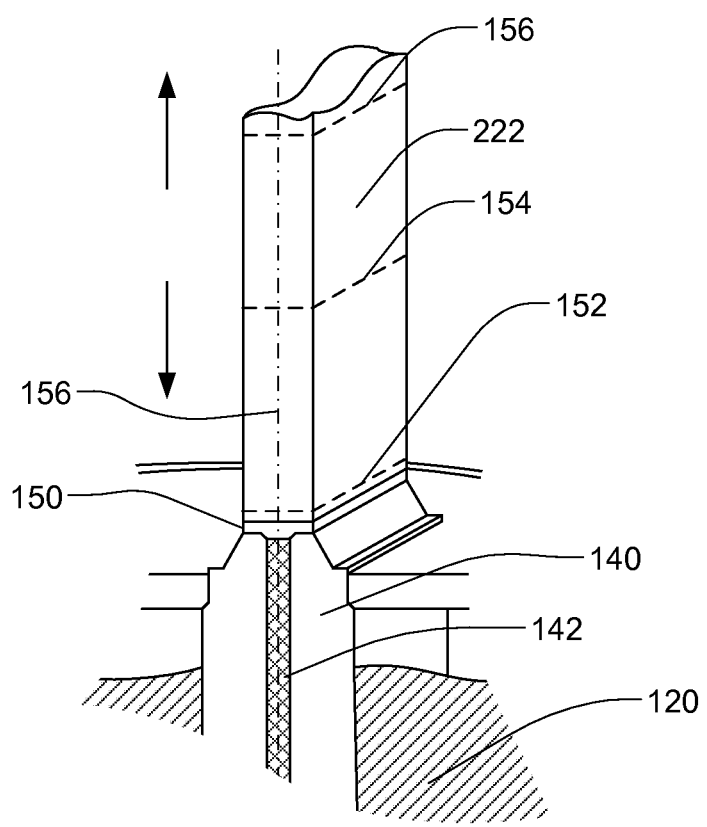
FIG. 3B is an enlarged view of a portion of the apparatus of FIG. 3A.

FIG. 3B provides an enlarged view of the central portion of the cross-sectional view of the apparatus of FIG. 3A. This detailed view shows die 140 including capillary channel 142 and melt interface 150 (at the die opening). Single crystal sapphire ribbon 222 may be pulled upwardly from melt interface 150 where crystallization begins to occur. Centerline 156 cuts through the central axis of ribbon 222 as well as die 140. Thus, the cutaway view of FIG. 3B reveals approximately one half of the ribbon and the die.

Dashed line 152 depicts the level of a melt interface. Dashed lines 154 and 156 depict different points on ribbon 222 that are positioned at different heights. As the ribbon is drawn upwardly, new material crystallizes at or adjacent to melt interface 152 and advances upwardly as the ribbon grows in length. As a portion of the ribbon advances from melt interface 152 to level 154 or to level 156 it may be cooled as it passes from a position of higher temperature (152) to a position of lower temperature (154). The rate of cooling of the ribbon may be dependent, in part, on both the temperature difference between the two positions as well as the speed at which the ribbon advances between the positions in an apparatus. The thermal gradient measured over the distance between two positions, for example 152 and 154, may be greater than 1° C./cm, greater than 2° C./cm, greater than 3° C./cm, greater than 5° C./cm, greater than 10° C./cm, greater than 20° C./cm, greater than 50° C./cm, greater than 100° C./cm, greater than 200° C./cm, greater than 500° C./cm or greater than 1000° C./cm and may be dependent, at least partially, on the distance between 152 and 154. The rate of cooling will also vary with the rate of growth of the ribbon as a ribbon drawn at a faster rate will reach a region of lower temperature in a shorter period of time.

The thermal gradient between positions 154 and 156 may be greater than, less than, or equal to the thermal gradient between 152 and 154. One, two, three or more different thermal gradients may be present in a single furnace or during a single production run.

At temperatures above about 1850° C. it has been determined that control of the cooling rate of a sapphire crystal may affect its crystalline quality. For example, if cooled too quickly, "slip" of one crystal plane over another may occur. Another type of crystalline defect that may be controlled by regulated cooling is dislocations. Once the temperature of the crystal drops below about 1850° C. it may be of a more stable single crystal structure and the rate of cooling may not need to be regulated as carefully. For instance, if the crystal exits the apparatus below its brittle-ductile transition point, it may be allowed to cool to room temperature at a rapid rate without any irreversible damage to the crystal.

Thermal gradients may be varied at any specific location in the apparatus although once ribbon production has started it may be preferred that gradients are maintained at constant values. However, gradients may be adjusted during production to compensate for variations in process parameters or to improve ribbon quality. Thermal gradients may be controlled by, for example, lowering or raising heat shields, adding or removing insulation, and/or actively heating or cooling a portion or portions of the apparatus.

Thermal gradients may be substantially constant over the length of the gradient. For instance, a thermal gradient may be substantially constant over a distance of less than 1 cm, greater than 1 cm, greater than 2 cm, greater than 3 cm, greater than 5 cm, greater than 10 cm, greater than 15 cm or greater than 20 cm. Thermal gradients may also vary over the length of the gradient, particularly at the beginning and/or end of the gradient. Of course, when moving from one gradient to another there may be a transition distance over which the gradient will shift from the first to the second gradient. Unless otherwise specified, a thermal gradient for a specific region is the average thermal gradient throughout the region.

A crystal plate may be formed using a shaped crystal growth technique and in many of these methods, such as edge defined film-fed growth techniques, as the crystal lengthens, any point on the crystal advances directionally through the apparatus. As the point moves through the apparatus it may dwell for different amounts of time in regions exhibiting different thermal gradients. Depending on, for instance, the speed of growth and the length of the region, the dwell time for a point in a specific thermal gradient may be, for example, greater than 1 minute, greater than 5 minutes, greater than 10 minutes, greater than 30 minutes, greater than 1 hour, greater than 2 hours or greater than 3 hours.

In some embodiments, the thermal gradient at a point near the melt interface may be greater than the thermal gradient at a cooling region (a point above or distal from the melt interface). For example, referring to FIG. 3B, if the distance between position 152 and position 154 is about 2.5 cm, the thermal gradient between 152 (at the melt interface) and 154 (thermal gradient 1) may be greater than or equal to 20° C./cm while a second thermal gradient (thermal gradient 2) between position 154 and position 156 (cooling region) may be less than or equal to 10° C./cm. In some embodiments, thermal gradient 1 may be greater than thermal gradient 2 and may be greater by a factor of more than 1.1, 1.5, 2, 3, 5 or 10. In other embodiments, thermal gradient 1 may be greater than thermal gradient 2 by more than 2° C./cm, more than 5° C./cm, more than 10° C./cm, more than 15° C./cm, or more than 20° C./cm. Depending on the specific apparatus and process parameters such as the draw rate, thermal gradient 1 (from 152 to 154)

may exist over a distance of, for example, greater than or equal to 1 cm, greater than or equal to 2 cm, greater than or equal to 3 cm, greater than or equal to 4 cm, greater than or equal to 5 cm, greater than or equal to 10 cm or greater than or equal to 20 cm. Thermal gradient 2 (from 154 to 156) may exist over a distance of, for example, greater than or equal to 1 cm, greater than or equal to 2 cm, greater than or equal to 3 cm, greater than or equal to 4 cm, greater than or equal to 5 cm, greater than or equal to 10 cm, greater than or equal to 20 or greater than or equal to 30 cm. In these and other embodiments, a specific thermal gradient may exist over a distance of less than or equal to 20 cm, less than or equal to 10 cm, less than or equal to 5 cm, less than or equal to 3 cm or less than or equal to 1 cm.

Typical draw rates may be, for example, less than 1 cm/hr, 1 cm/hr, 2 cm/hr, 3 cm/hr, 4 cm/hr, 5 cm/hr, 6 cm/hr or more. As draw rates increase, the dwell time in each thermal gradient region decreases. Thus, to subject a ribbon to similar cooling conditions, an increase in draw rate may be accompanied by an extended thermal gradient region.

FIG. 4 illustrates, in cross-section, a crystal growth apparatus similar to that shown in FIG. 3A except that it includes three dies to produce three ribbons in parallel. Included in the apparatus of FIG. 4 are horizontal heat shields 160 that can be adjusted to maintain a relatively constant rate of cooling and maintenance of the thermal gradient as described in U.S. Patent Application Publication 2005/0227117. Also included is insulation layer 170 that may help to retain heat.

FIG. 5 illustrates one embodiment of a crystal growth apparatus that may be used to produce C-plane single crystal material. The figure provides a cutaway view from one end of apparatus 200, with 3 ribbons 222 being formed vertically. A ribbon is formed in a "downstream" direction, typically cooling as it progresses downstream. In the embodiment of FIG. 5, downstream is the upward vertical direction. The major plane of the ribbons, in this case the C-plane, is facing to the left and right in the figure and the view is from along an edge of each ribbon, revealing the ribbon thickness. Crystal growth apparatus 200 may include any or all of the components of crystal growth apparatus 100 such as horizontal heat shields 260 and insulation layer 272. The apparatus may include a melt source such as a melt fixture. In the illustrated embodiment, the melt fixture may be a crucible 210. Crucible 210 can be designed to hold melt 220 which may be, for example, molten $Al_2O_3$. Crucible 210 may be made of any material capable of containing the melt. Suitable materials may include, for example, iridium, molybdenum, tungsten or molybdenum/tungsten alloys. Molybdenum/tungsten alloys may vary in composition from 0 to 100% molybdenum.

Die 224 may be in fluid communication with crucible 210 and may be made of any appropriate material. Materials may be identical or similar to those used for the crucible. The die may be used to form 1, 2, 3, 4, 5, 6, 7, 8, 9, 10 or more ribbons concurrently. For each ribbon to be formed, the die may include a cavity dimensioned to draw melt upwardly from the crucible to die opening 226 via capillary action. Die opening 226 can be dimensioned to match the desired width and depth dimensions of the ribbon to be drawn. For instance, the die opening may have a width of 5, 7.5, 10, 13, 15 or more cm and a depth of less than 0.1, 0.1, 0.2, 0.5 or 1.0 centimeters, or greater. The length of the ribbon may be determined by the length of the draw. Ribbons may be drawn, for example, to lengths of greater than or equal to 10 cm, 20 cm, 30 cm, 50 cm, 100 cm, 150 cm, or 200 cm.

Crystal growth apparatus 200 may also include afterheater 276 that may retain heat, reduce the rate of cooling or increase the temperature in the space containing the ribbon or ribbons downstream of the melt interface. Afterheater 276 may be positioned so that it can supply heat to a portion of the apparatus that is downstream of the melt interface (die opening 226) by a distance of greater than or equal to 1 cm, greater than or equal to 2 cm, greater than or equal to 3 cm, greater than or equal to 5 cm, or greater than or equal to 10 cm. Afterheater 276 may reduce the thermal gradient in the region in which it is effective, for example, in thermal gradient zone Z2. During operation, afterheater 276 may provide heat to a portion of the apparatus that contains crystallized sapphire that is downstream of the melt interface. The heater may be, for example, an electrical resistance heater or an inductively coupled heater. Afterheater 276 may be used to vary the thermal gradient and may form a thermal gradient zone (Z2) that may be adjacent to, but distinct from, a melt interface region (Z1) at the die opening 226 of the apparatus. The afterheater may be sized appropriately for the crystals being produced. The afterheater may be, for example, square, rectangular or composed of non-continuous plates. The afterheater may include, for example, a container 270 composed of molybdenum and/or an alloy of molybdenum and may also include inductive heating coil 232. Inductive heating coil 232 can be inductively coupled to enclosure 270 to heat the enclosure and the area containing the sapphire ribbon. Afterheater 276 may be similar or identical to heater 230 that is used to heat the lower portion of the apparatus including, for example, the crucible and the die. These two heaters may be controlled by a common controller or may be controlled independently of each other. Each of the heaters may supply a different energy flux to different portions of the apparatus resulting in different temperatures and thus different temperature gradients in different regions. Other factors, for example materials of composition, insulation and surface area, may also affect temperature and thermal gradient. The heaters may be spaced appropriately for heating (or reducing heat loss) different regions of the apparatus and may be, for example, greater than 1 cm, greater than 2 cm, greater than 5 cm, greater than 10 cm or greater than 20 cm apart from each other.

Insulating shield 272 may aid in reducing heat loss and can be made of a material capable of withstanding high temperature while also providing insulating value. When the apparatus includes an induction coil, the insulating shield may be of a material that does not couple with the induction coil. In other cases, the shield may partially couple to the electric field and may also provide an additional source of heat. For instance, in some embodiments, shields may be formed from graphite. Insulating shield 272 and/or afterheater 276 may be useful in altering a thermal gradient or gradients that provide for the formation of C-plane single crystal sapphire having an absence of polycrystallinity.

In some embodiments, the thermal gradient may be greater in the region of the melt interface than it is above the melt interface. In this manner, a portion of a sapphire ribbon may cool at a faster rate immediately after formation at the die than when it later passes through the afterheater portion. Thus, a specific point on a ribbon may be cooled at a higher rate when first crystallized and then at a lower rate as the same point on the ribbon rises through the afterheater zone. At some locations, the thermal gradient may be zero which may result in a constant rate of heat loss in the ribbon throughout the gradient.

By cooling a ribbon more quickly at the point of crystallization (near the melt interface) and less quickly at a point, for example, 5 cm, 10 cm, 15 cm, 20 cm or more above the die opening, dislocations and/or polycrystallization in the material may be significantly reduced or eliminated. In some embodiments, C-plane single crystal sapphire ribbons may contain fewer than 500 dislocations/cm$^2$, fewer than 250 dislocations/cm$^2$, fewer than 100 dislocations/cm$^2$, fewer than 10 dislocations/cm$^2$ or even fewer than one dislocation/cm$^2$ when determined by XRT.

In one embodiment, illustrated in FIG. 5, C-plane single crystal sapphire production may be started by preparing an alumina melt in crucible 220. Material may be fed to the crucible prior to production or may be fed constantly or intermittently during production. Once the melt achieves temperature it can flow, via capillary action, up through cavities in die 224 (more easily seen in FIG. 3) to die opening 226. The die shown in FIG. 5 includes three cavities and three associated die openings for concurrently producing three C-plane single crystal sapphire ribbons. A die of any practical number of cavities may be used. A seed crystal, with its c-axis aligned from right to left according to FIG. 5, is placed in contact with the melt at the melt interface in the hot zone. As the seed is drawn vertically upward (downstream) cooling begins and the melt may start to crystallize around the seed in a crystalline orientation that matches that of the seed. The drawing process may proceed initially at a rate of about 1 to 15 cm/hr and, after a neck is formed, the rate may be maintained constant or may be changed to a different rate. After neck formation, the spread may grow and the temperature in the apparatus may be increased during this period. Once the width of the ribbon equals the width of die opening 226, the ribbon can be drawn at a width and thickness that are determined by the dimensions of die opening 226. Drawing may continue to extend the ribbon to a desired length.

In some embodiments, once a point on the sapphire ribbon passes beyond region Z1, the thermal gradient may be reduced. This can reduce the rate of cooling and may help to limit polycrystallinity. Region Z2 may include additional insulation and/or an additional heater such as an inductively coupled heater or resistive heater. As the sapphire ribbon grows, any point on the sapphire ribbon may pass from a region having a high thermal gradient (Z1) to another region exhibiting a lower thermal gradient (Z2). Two or three different areas in substantially vertical or sequential alignment (that may include a crucible, for example) may exhibit different thermal gradients with an upper thermal gradient region providing less heat loss than a lower thermal gradient region. For example, zone Z1 may exhibit a thermal gradient of 20° C./cm and Z2 may have a gradient of 4° C./cm. Zone Z0 in the crucible region may exhibit a thermal gradient of zero or close to zero, providing for a substantially constant temperature throughout the melt and the die. Thermal gradients may be varied with different rates at which the crystal is grown. For instance, for growth at a rate of from about 2 cm/hr to about 5 cm/hr the temperature gradient at Z1 may be, for example, between about 20° to 60° C./cm. The temperature gradient at Z2 may be, for example, from about 3° to 15° C./cm and preferably about 8° to 10° C./cm.

Temperature gradient may also be affected by gas flow through the apparatus. For instance, an inert gas such as argon may be flowed upwardly through the apparatus along the sapphire ribbon as it is being formed. It has been found that a flow rate of about 20 scfh can be used to help achieve the desired temperature gradients. Control of this flow rate may provide another method for adjusting the temperature gradient.

Of course, additional downstream regions (cooler regions) may exhibit other gradients to allow the material to cool to room temperature or closer to room temperature at the end of production. For example, a point on a ribbon may pass from a region exhibiting a high thermal gradient (region A) to a region of low thermal gradient (region B) and, optionally, to a third region (region C) having a high thermal gradient. When comparing thermal gradients of these regions, B may be less than A and B may be less than C. A may be less than or equal to or greater than C.

Using the methods described herein, ribbons, or plates, of C-plane single crystal sapphire have been produced in lengths of greater than 10 cm, greater than 20 cm, greater than 30 cm and greater than 50 cm. Ribbons have been grown at widths of 15 and 20 cm resulting in the capability of producing C-plane ribbons having surface areas of about 1 m$^2$. Circular wafers of up to 20 cm in diameter can be produced from these plates. These ribbons, plates and resulting wafers can contain fewer than 1000 dislocations/cm$^2$, fewer than 100 dislocations/cm$^2$ or fewer than 10 dislocations/cm$^2$.

EXAMPLES

Five centimeter width and ten centimeter width C-plane single crystal sapphire ribbons were produced using two different embodiments of apparatuses and methods. In the first example, the apparatus exhibited a substantially constant thermal gradient above the melt interface. In the second, an apparatus that exhibited a greater thermal gradient (than the first apparatus) in a first region (Z1) and a lower thermal gradient (than the first apparatus) in a second region (Z2) was used.

Example 1

In a first example, a technique for producing C-plane single crystal sapphire plate was attempted using apparatus and conditions known for producing a-plane material. In the apparatus a molybdenum crucible was filled with a supply of alumina adequate to produce a 30 cm long ribbon having a width of 10 cm and a thickness of 0.15 cm. The melt was maintained at about 2050° C. by inductively coupled heating. The apparatus included a molybdenum die having three vertically oriented capillary ducts that exited at die openings, each of which had a width of 10 cm and a thickness of 0.15 cm. A seed crystal of sapphire was contacted with the melt at the die opening. The seed crystal was oriented with its c-axis normal to the major vertical plane of the die. The seed was then drawn upwardly at a rate of 2.5 cm/hr. The heat loss directly above the die opening was controlled by a low thermal gradient section of the apparatus including insulation and heat shields. As the ribbon was drawn higher, the thermal gradient increased, allowing the ribbon to cool at a faster rate as it achieved a higher position in the apparatus. This may be similar or identical to a technique used to produce a-plane single crystal sapphire, except for the seed orientation.

Example 2

In Example 2, a single crystal growth apparatus such as that shown in FIG. 5 was used. It differed from the apparatus used in Example 1. For instance, an afterheater above the hot zone was used to form a region of a reduced thermal gradient. The afterheater including a molybdenum enclosure 270, a second induction heating coil 232 and horizontal heat shields 260 spaced closer together than in the apparatus of Example 1. In addition, the single crystal growth apparatus of Example 2 included graphite insulation 272 surrounding the hot zone to a height of about 15 cm. The apparatus included a molybdenum triple die and molybdenum crucible as in Example 1.

The crucible was charged with alumina and heated to 2050° C. to provide the melt. The melt progressed upwardly to the die openings via capillary action. A seed crystal of sapphire was contacted with the melt at the die opening. The seed crystal was oriented with its C-axis normal to the major vertical plane of the die to crystallize a C-plane ribbon. The seed was then drawn upwardly at a rate of 2.5 cm/hr.

At zone Z1, the ribbon was exposed to an area having a greater thermal gradient (more heat loss) than at an equivalent point in Example 1. At zone Z1, the thermal gradient was about 40° C./cm while at zone Z2 the ribbon was exposed to an area having a lower thermal gradient (less heat loss) than at an equivalent point in Example 1. At zone Z2, the thermal gradient was about 10° C./cm. Ribbons were drawn to a length of 40 cm.

The C-plane products produced in both Example 1 and Example 2 were evaluated by visually inspecting each ribbon and by examining the X-ray Transmission (XRT) results of each of the ribbons. XRT can provide an indication of the number of dislocations in each sample and can identify polycrystallinity.

Figure 6:
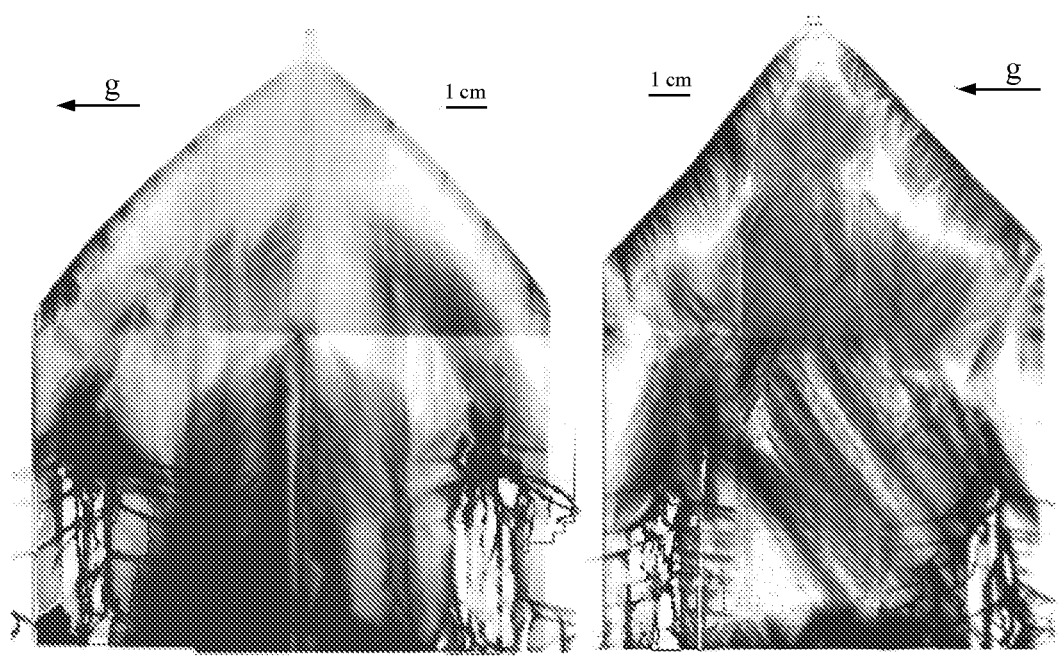
FIG. 6 provides a photocopy of an X-ray topograph of C-plane ribbons exhibiting high polycrystallinity.

FIG. 6 is a photocopy of the XRT results of the material made using the process of Example 1. There are many dislocations and polycrystallinity is visible about half way down the ribbon.

Figure 7:
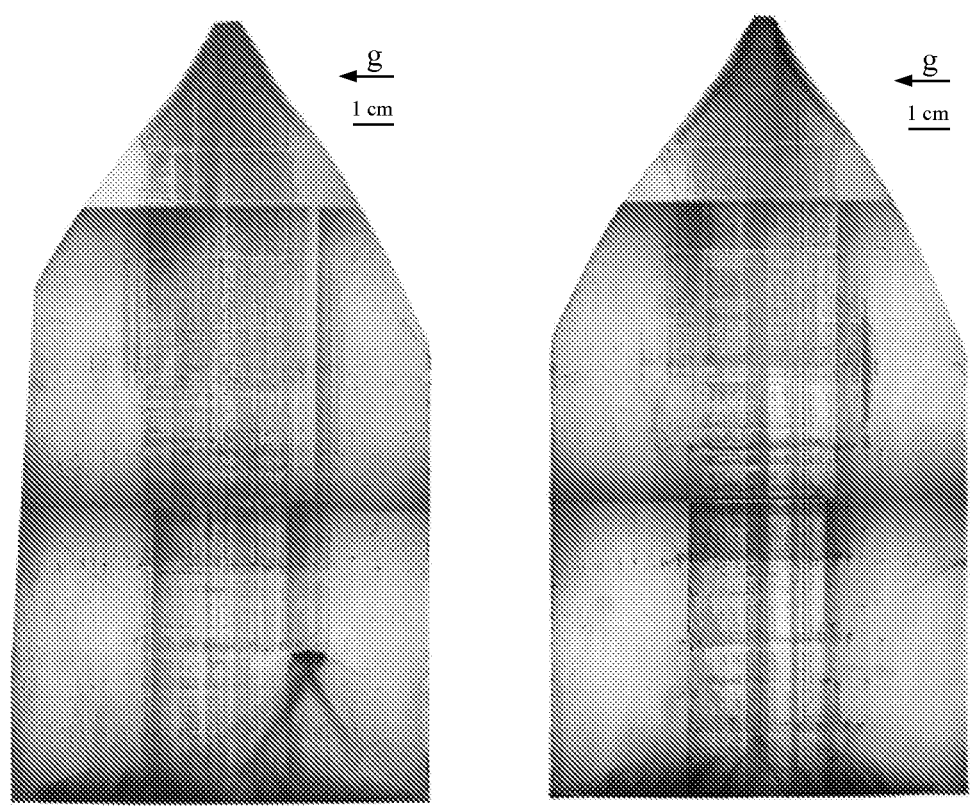
FIG. 7 provides a photocopy of an X-ray topograph of C-plane single crystal sapphire ribbons of one embodiment exhibiting low polycrystallinity.

FIG. 7 is a photocopy of the XRT results of C-plane single crystal sapphire made using the process of Example 2. Analysis of the XRT results shows fewer than 100 dislocations per square centimeter indicating a high quality 10 cm wide ribbon of C-plane single crystal sapphire. Post-growth annealing was not required. Ribbons produced by the method and apparatus of Example 2 may be used to produce 10 cm (100 mm) C-plane single crystal sapphire wafers that may be used, for example, as a substrate for gallium nitride epitaxial growth for the production of light emitting diodes or laser diodes. The ribbon may be grown to the appropriate thickness and circular wafers may be formed by core drilling through a single thickness of the ribbon and then grinding, lapping and polishing to typical wafer tolerances. In contrast, wafers formed from a boule are typically core drilled and then wire sawed and subsequently ground, lapped and polished. Thus, shaped growth techniques can eliminate the need for extensive wire sawing.

Figure 8:
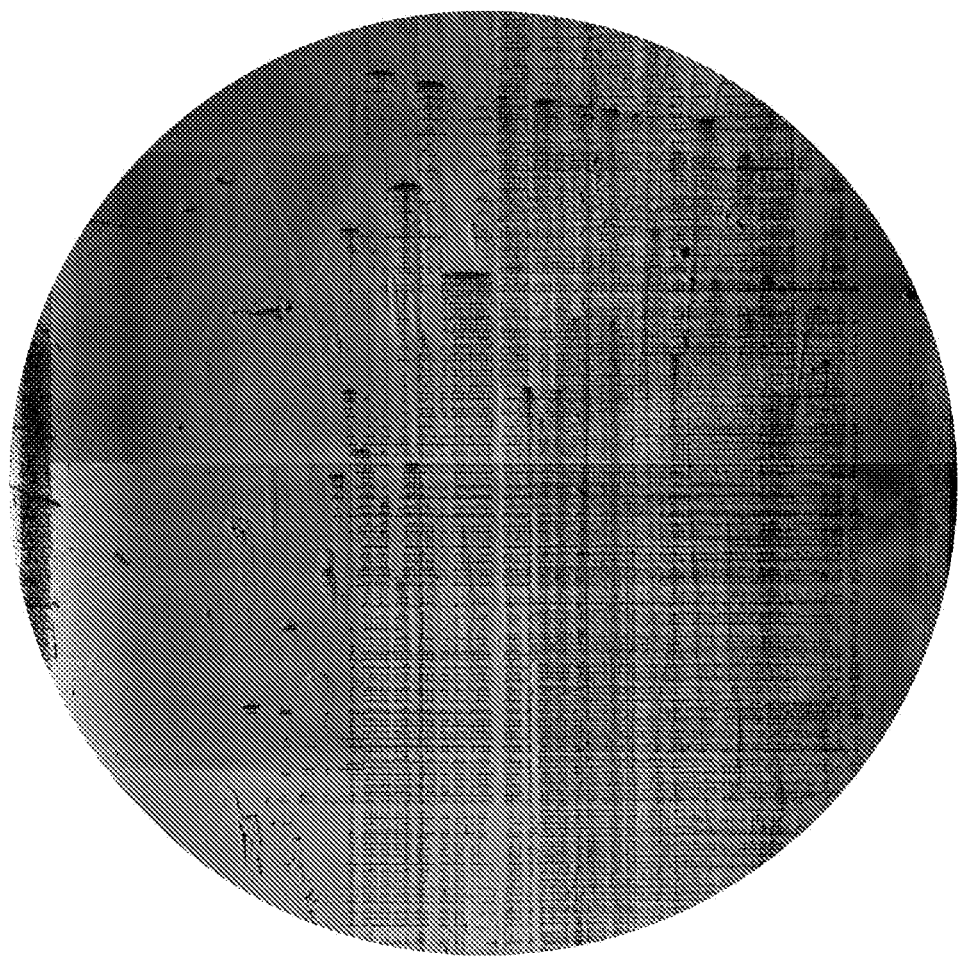
FIG. 8 is a photocopy of an X-ray topograph of a 10 cm diameter C-plane wafer formed from a plate produced using the method described herein.
Figure 9:
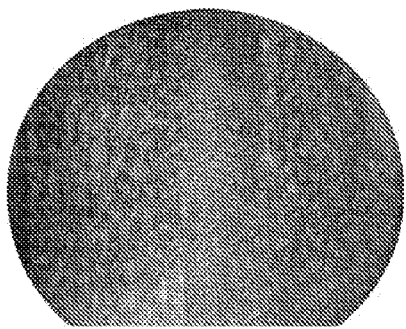
FIG. 9 is a photocopy of an X-ray topograph of a 5 cm C-plane wafer produced using the Czochralski technique.
Figure 10:
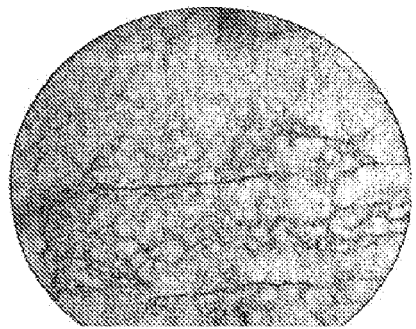
FIG. 10 is a photocopy of an X-ray topograph of a 5 cm C-plane wafer produced using the Kyropoulos technique.
Figure 11:
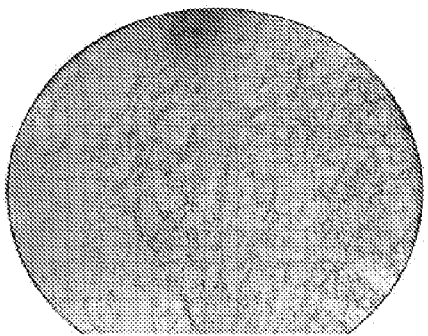
FIG. 11 is a photocopy of an X-ray topograph of a 5 cm C-plane wafer produced using the heat exchanger method.
Figure 12:
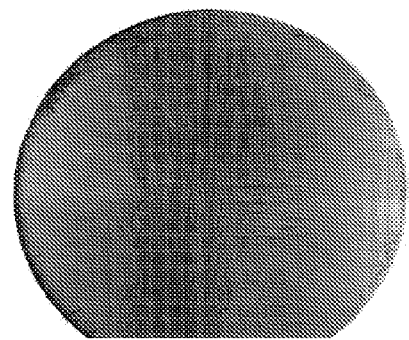
FIG. 12 is a photocopy of an X-ray topograph of a 5 cm C-plane wafer produced using a traditional EFG technique.
Figure 13:
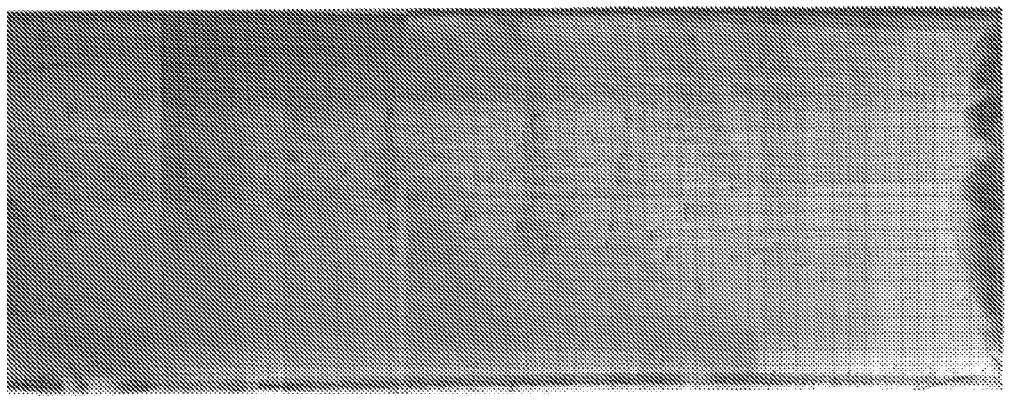
FIG. 13 is a photocopy of an X-ray topograph of a 10 cm×30 cm C-plane ribbon produced using the method described herein.

FIGS. 8-13 provide a comparison between C-plane single crystals grown by the method described herein and with those produced using known techniques. FIG. 8 provides an x-ray topograph of a 10 cm C-plane single crystal sapphire wafer cut from a plate grown using the technique of Example 2. An x-ray topograph of a plate (10 cm by 30 cm) produced using the same technique and showing fewer than 10 dislocations per cm$^2$ is provided in FIG. 13. In both of FIGS. 8 and 13 there are lines showing surface bubbles (these can be polished out) but very few, if any, of the hair like features that indicate dislocations. In contrast, the x-ray topographs in FIGS. 9-12 each show numerous dislocations. FIGS. 9-12 each provide a photocopy of an x-ray topograph of a 5 cm C-plane wafer produced by a known method. FIG. 9 is from a wafer produced using the Czochralski method. Examination shows a dislocation density of about 10,000 dislocations per cm$^2$. FIG. 10 is a wafer made from a crystal using the Kyropoulos technique and shows a dislocation density of about 1000 dislocations per cm$^2$. FIG. 11 is a wafer made from a crystal using the heat exchanger method and shows a dislocation density of about 1000 dislocations per cm$^2$. FIG. 12 is a wafer made from a crystal using the EFG technique and shows a dislocation density of about 1000 dislocations per cm$^2$.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

All references, patents and patent applications and publications that are cited or referred to in this application are incorporated in their entirety herein by reference.

What is claimed is:

1. An as-grown C-plane single crystal sapphire ribbon having a neck and a body with substantially planar major surfaces, wherein the ribbon has a width of greater than or equal to 7.5 cm, a length of greater than the width, and fewer than 900 dislocations per cm$^2$ when measured through a thickness of the crystal using transmission X-ray diffraction topography based on Bragg diffraction, wherein the as-grown C-plane single crystal sapphire ribbon is formed by an edge defined film-fed growth technique.

2. The as-grown C-plane single crystal sapphire ribbon of claim 1 having a width of greater than or equal to about 10 cm.

3. The as-grown C-plane single crystal sapphire ribbon of claim 1 exhibiting fewer than 900 dislocations per cm$^2$ when measured through the thickness of 0.15 cm using the transmission X-ray diffraction topography based on Bragg diffraction.

4. The as-grown C-plane single crystal sapphire ribbon of claim 1 exhibiting fewer than 100 dislocations per cm$^2$ when measured through the thickness of 0.15 cm using the transmission X-ray diffraction topography based on Bragg diffraction.

5. The as-grown C-plane single crystal sapphire ribbon of claim 1 exhibiting fewer than 10 dislocations per cm$^2$ when measured through the thickness of 0.15 cm using the transmission X-ray diffraction topography based on Bragg diffraction.

6. The as-grown C-plane single crystal sapphire ribbon of claim 1 exhibiting fewer than 500 dislocations per cm$^2$ when measured through the thickness of 0.15 cm using the transmission X-ray diffraction topography based on Bragg diffraction.

7. The as-grown C-plane single crystal sapphire ribbon of claim 1, wherein the width is greater than or equal to 15 cm.

8. The as-grown C-plane single crystal sapphire ribbon of claim 1 exhibiting fewer than 500 dislocations per $cm^2$.

9. The as-grown C-plane single crystal sapphire ribbon of claim 1 exhibiting fewer than 100 dislocations per $cm^2$.

* * * * *